US007478925B2

(12) United States Patent
Hiyama et al.

(10) Patent No.: US 7,478,925 B2
(45) Date of Patent: Jan. 20, 2009

(54) LIGHTING SOURCE UNIT, ILLUMINATING APPARATUS USING THE SAME AND DISPLAY APPARATUS USING THE SAME

(75) Inventors: Ikuo Hiyama, Hitachinaka (JP); Hiroki Kaneko, Hitachi (JP); Toshiaki Tanaka, Hitachi (JP); Tsunenori Yamamoto, Hitachi (JP); Akitoyo Konno, Hitachi (JP); Katsumi Kondo, Mito (JP); Haruo Akahoshi, Hitachi (JP)

(73) Assignee: Hitachi Displays, Ltd., Tokyo (JP)

( * ) Notice: Subject to any disclaimer, the term of this patent is extended or adjusted under 35 U.S.C. 154(b) by 146 days.

(21) Appl. No.: 11/265,259

(22) Filed: Nov. 3, 2005

(65) Prior Publication Data

US 2006/0092634 A1 May 4, 2006

(30) Foreign Application Priority Data

Nov. 4, 2004 (JP) ............................ 2004-320383

(51) Int. Cl.
*F21V 21/00* (2006.01)

(52) U.S. Cl. ........................ 362/249; 362/231; 313/512

(58) Field of Classification Search ................. 362/231, 362/249, 560; 315/149, 308, 309; 313/512
See application file for complete search history.

(56) References Cited

U.S. PATENT DOCUMENTS

| | | | | |
|---|---|---|---|---|
| 3,875,456 | A | 4/1975 | Kano | |
| 5,559,681 | A | 9/1996 | Duarte | |
| 6,614,179 | B1 * | 9/2003 | Shimizu et al. | 313/512 |
| 6,692,137 | B2 * | 2/2004 | Blanchard | 362/241 |
| 7,183,727 | B2 * | 2/2007 | Ferguson et al. | 315/308 |

FOREIGN PATENT DOCUMENTS

| | | |
|---|---|---|
| JP | 7-1804 | 1/1995 |
| JP | 7-235624 | 9/1995 |
| JP | 2519341 | 5/1996 |
| JP | 2521493 | 10/1996 |
| JP | 8-339707 | 12/1996 |
| JP | 9-33924 | 2/1997 |
| JP | 2000-262265 | 9/2000 |
| JP | 2001-351404 | 12/2001 |

OTHER PUBLICATIONS

Robert Scott West et al., "43.4: High Brightness Direct LED Backlight for LCD-TV", SID 2003 Digest, pp. 1262-1265.

Michel J. Zwanenburg et al., "41,2: High-efficiency LEDs for LCD Backlights", SID 2004 Digest, pp. 1222-1225.

* cited by examiner

*Primary Examiner*—John A Ward
(74) *Attorney, Agent, or Firm*—Antonelli, Terry, Stout & Kraus, LLP.

(57) ABSTRACT

A thin light source unit employs a plurality of light emitting diode chips in multiple colors to generate highly uniform white light at a low cost and with a high light utilization efficiency. The light source unit has light emitting diode chips, lead frames, and a transparent sealer. A plurality of the light emitting diode chips in the same color are connected in series to three or more sets of the lead frames. The light emitting diode chips in at least three different colors are integrally sealed with the transparent sealer. An illuminating apparatus using the light source units, and a display apparatus using the illuminating apparatus are also provided.

22 Claims, 10 Drawing Sheets

LIGHTING SOURCE UNIT, ILLUMINATING APPARATUS USING THE SAME AND DISPLAY APPARATUS USING THE SAME

CROSS-REFERENCE TO RELATED APPLICATION

The present application is related to U.S. Patent Application entitled "Illuminating Apparatus and Display Apparatus Using the Same" in the name of Toshiaki Tanaka, Hiroki Kaneko and Ikuo Hiyama, based on Japanese Patent Application No. 2004-320136 filed on Nov. 4, 2004, and U.S. Patent Application entitled "Illuminating Apparatus, Method for Fabricating the Same and Display Apparatus Using the Same" in the name of Hiroki Kaneko, Ikuo Hiyama, Toshiaki Tanaka, Masaya Adachi, Tsunenori Yamamoto and Haruo Akahoshi, based on Japanese Patent Application No. 2004-320409 filed on Nov. 4, 2004, and the contents of which are incorporated herein by reference.

BACKGROUND OF THE INVENTION

The present invention relates to a light source unit using light emitting diodes, an illuminating apparatus, and a display apparatus using this illuminating apparatus for illuminating a non-light emitting image display panel.

An improved light emitting efficiency of recent light emitting diodes (LED) drives an ever replacement of light sources for a variety of illuminating apparatuses from fluorescent lamps to light emitting diodes. This is because the light emitting diodes have many features such as smaller size, ability to generate multiple colors, ease of control, low power consumption and the like. However, since light output of a single light emitting diode is still insufficient in applications which require high light outputs, a plurality of light emitting diodes are arrayed to make up an illuminating apparatus.

For example, in a liquid crystal display (liquid crystal display apparatus) which is a typical example of a display apparatus using a non-light emitting image display panel, an illuminating apparatus is made up of an array of plural light emitting diode packages, which emit light red, green, and blue light, respectively, for use as a back light, as described in SID03 Digest, pp. 1262-1265 (2003). Also, as described in SID04 Digest, pp. 1222-1225 (2004), a red, a green, and a blue light emitting diode are disposed in the same package, a plurality of which are arranged in combination with light guiding plates to build an illuminating apparatus which is used as a back light. Further, JP-A-8-339707, JP-U-7-1804, JP-A-7-235624, JP-A-2000-262265, JP-A-2001-351404, Japanese Patent No. 2519341, JP-U-2521493, and JP-A-9-33924 describe signal lamps for automobile, each of which has light emitting diodes mounted on a series of lead frames.

However, when light emitting diodes are packaged and a plurality of the resulting packages are arrayed as described in SID03 Digest, pp. 1262-1265 (2003) and SID04 Digest, pp. 1222-1225 (2004), each package must be again mounted on a printed circuit board by soldering or the like, thus causing an increased cost for the mounting, and a problem with regard to the reliability due to the double mounting, i.e., mounting of light emitting diodes in packages, and mounting of the packages on a printed circuit board.

On the other hand, when a plurality of light emitting diodes area arrayed on a series of lead frames as described in JP-A-8-339707, JP-U-7-1804, JP-A-7-235624, JP-A-2000-262265, JP-A-2001-351404, Japanese Patent No. 2519341, JP-U-2521493, and JP-A-9-33924, the mounting cost can be reduced because the light emitting diodes are connected to the lead frames at a smaller number of spots. However, when the signal light is used for illuminating a non-light emitting image display panel which needs a white illumination light source, the signal light is disadvantageous in the light utilization efficiency and thickness in order to mix red, green, and blue color light to generate white illuminating light, particularly when red, green, and blue light emitting diodes are used, because of the lack of color mixing means.

SUMMARY OF THE INVENTION

It is an object of the present invention to provide a white light source unit which is created at a low cost and in a small thickness using a plurality of light emitting diode chips that emit a plurality of colors to exhibit a high light utilization efficiency and a high color uniformity, an illuminating apparatus using the same, and an image display apparatus using the illuminating apparatus. Other objects of the present invention will be made apparent in the following description of embodiments.

To achieve the above object, the present invention provides a light source unit which includes light emitting diode chips, lead frames, and a transparent sealer, where there are at least three sets or more of the lead frames, and a plurality of light emitting diode chips for radiating (hereinafter also expressed by "emitting") light of the same color are connected in series to each set of lead frames. The light emitting diode chips in at least three different colors are integrally sealed with the transparent sealer.

Also, to achieve the above object, the present invention provides an illuminating apparatus which includes the light source units arranged in M rows×N columns (M, N are integers equal to or more than one, and at least one of M and N is an integer equal to or more than two), and a diffuser panel disposed over the light source unit (on the light emitting side) through a gap.

Further, to achieve the above object, the present invention provides a display apparatus which employs the illuminating apparatus as a back light for a non-light emitting image display panel.

The configuration of the light source unit, illuminating apparatus, and display apparatus for achieving other objects of the present invention will be made apparent in the following description of embodiments With the foregoing configuration, the present invention provides a thin light source unit which produces highly uniform white light at a low cost and with a high light utilization efficiency, an illuminating apparatus using the light source units, and a display apparatus using the illuminating apparatus.

Other objects, features and advantages of the invention will become apparent from the following description of the embodiments of the invention taken in conjunction with the accompanying drawings.

BRIEF DESCRIPTION OF THE DRAWINGS

FIG. 1A is top plan view of the light source unit, FIG. 1B is a cross-sectional view of the light source unit taken along a line A-A' in FIG. 1A, and FIG. 1C is a cross-sectional view of the light source unit taken along a line B-B' in FIG. 1A;

FIG. 4A is a top plan view of the light source unit, and FIG. 4B is a cross-sectional view taken along a line B-B' in FIG. 4A;

FIG. 7A is a top plan view of the light source unit, and FIG. 7B is a cross-sectional view taken along a line B-B' in FIG. 7A;

FIGS. 9A, 9B show top plan views of the light source unit, and FIG. 9C shows a cross-sectional view taken along a line C-C' in FIG. 9A;

DETAILED DESCRIPTION OF THE EMBODIMENTS

In the following, preferred embodiments of a light source unit according to the present invention, an illuminating apparatus, and a display apparatus using the illuminating apparatus will be described in detail with reference to the accompanying drawings.

First Embodiment

Figure 1A:
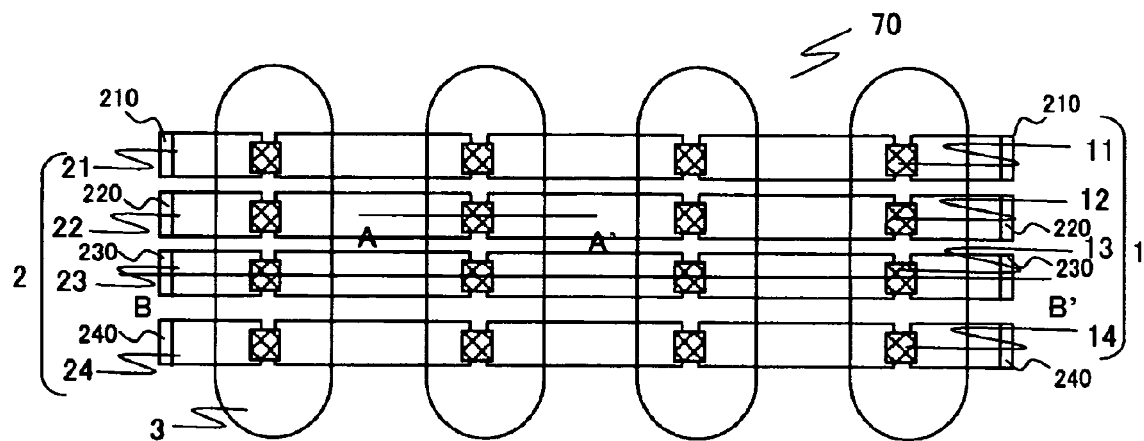
FIGS. 1A-1C are diagrams for describing a light source unit according to a first embodiment of the present invention, where
Figure 1B:
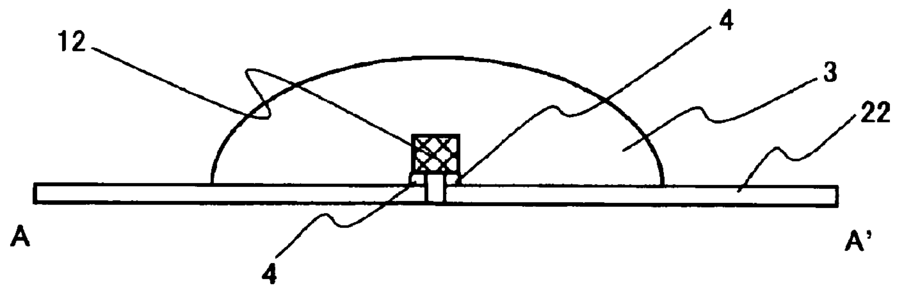
Figure 1C:
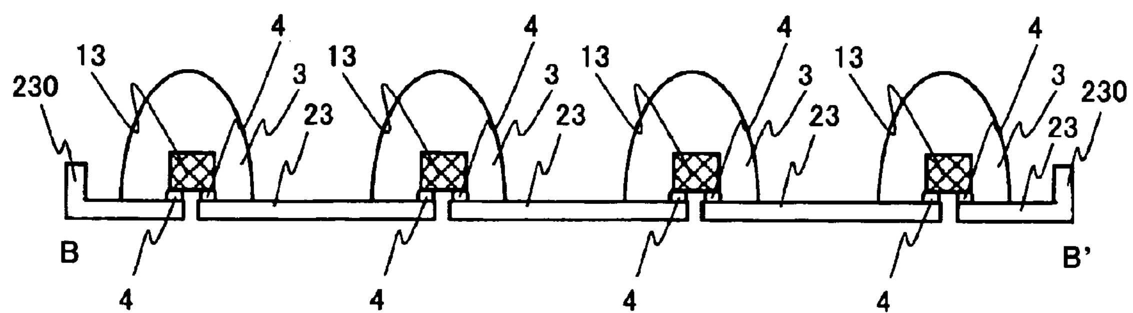

FIGS. 1A to 1C are diagrams for describing a light source unit 70 according to a first embodiment of the present invention, where FIG. 1A shows a top plan view of the light source unit; FIG. 1B shows a cross-sectional view taken along a line A-A' in FIG. 1A; and FIG. 1C shows a cross-sectional view taken along a line B-B' in FIG. 1A (along the longitudinal direction of a lead frame 23). The light source unit 70 comprises a plurality (four in FIG. 1A) of light emitting diode chips 1 (11-14); a plurality of sets (four sets in FIG. 1A) of lead frames 2 (21-24); and a transparent sealer 3.

Each of the lead frames 21-24 includes bends 210-240 at both ends thereof extending in a direction in which the light emitting diode chips emit light. The bends 210-240 have a function of positioning the associated lead frame to adjacent members when they are mounted in a display apparatus, a function of power supply terminals, and a function of facilitating mounting operations. Therefore, the bends 210-240 are arbitrary in the bending direction and shape. In addition, the bends are not limited to those formed at both ends of the lead frame. It should be noted that the bends 210-240 are not essential. The same applies to other embodiments later described.

While FIG. 1 shows four sets of the lead frames 2, no problem will arise as long as there are three or more sets of the lead frames 2, in consideration of mounting of the red, green, and blue light emitting diodes. Also, the light source unit 70 employs four diode chips 1 which include red (11), green (12), green (13), and blue (14) light emitting diode chips. Each light emitting diode chip 1 (11-14) is mounted on the lead frame 2 (21-24) by solder 4. Further, these light emitting diode chips are integrally sealed by the transparent sealer 3. In the first embodiment, the transparent sealer 3, the light emitting diode chips 1 sealed thereby, and the lead frames 2 make up one unit which is called a "light source unit." In FIG. 1, the illustrated components form a single light source unit.

The light source unit of the present invention emits light by applying a predetermined voltage between both ends of each lead frame 21-22, which is mounted with the light emitting diode chips 11-14, to allow a current to flow therethrough. Arbitrary colors can be selected for the light emitted from the light emitting diodes 1 from the whole visible light range because a semiconductor layer of the light emitting diode chip can be changed in composition, structure, manufacturing method and the like.

Also, in the first embodiments, the light emitting diode chips employed to emit light in three colors are placed in close proximity to one another and integrally sealed by the transparent sealer, so that the three colors can be efficiently mixed. Further, the light emitting diode chips of the same color are connected in series such that they can be controlled independently on a color-by-color basis and a plurality of light emitting diode chips can be controlled simultaneously, thus making it possible to reduce the number of control circuits as well as to arbitrarily control the color. Furthermore, for modulating the brightness of each color, a pulse width modulation is preferably used such that the brightness can be arbitrarily varied with less variations in each color.

Figure 2A:
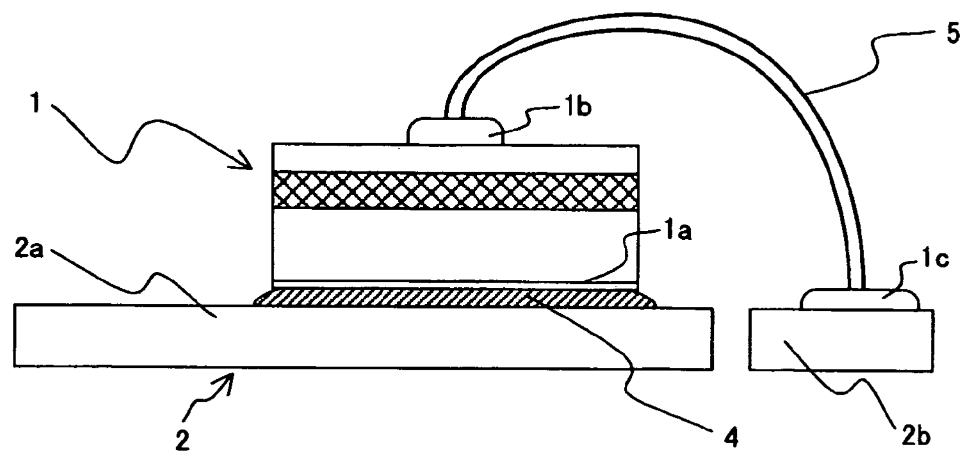
FIGS. 2A-2C are diagrams for describing a variety of methods of mounting a light emitting diode chip on a lead frame.
Figure 2B:
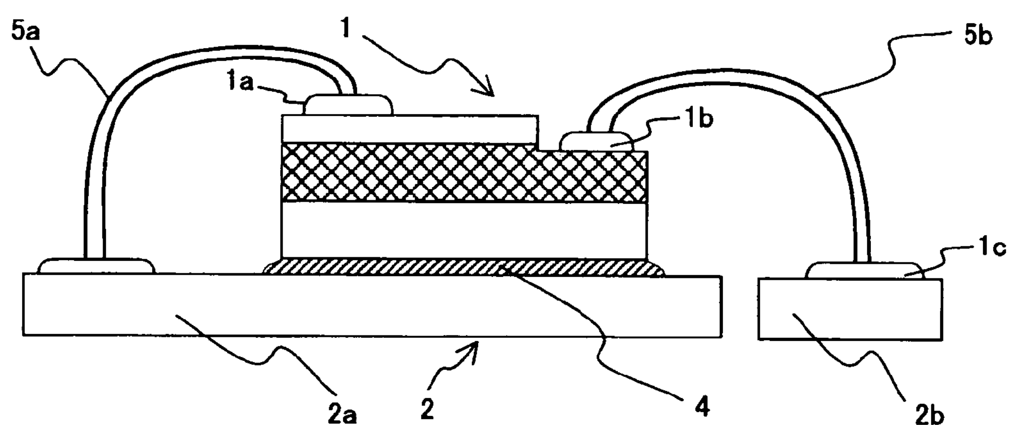
Figure 2C:
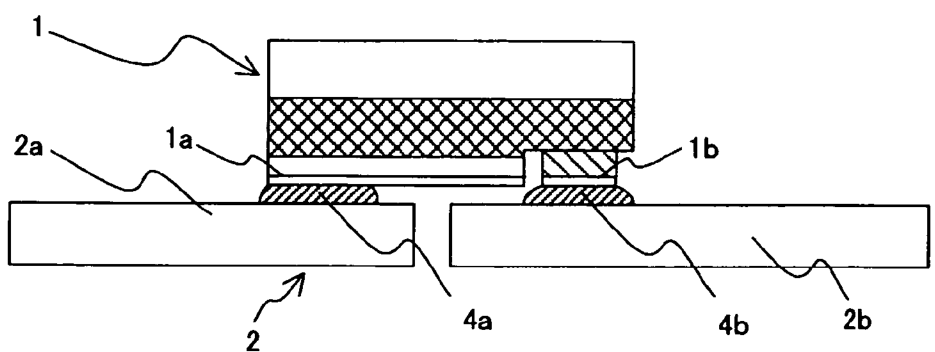

FIGS. 2A-2C are schematic diagrams for describing a variety of methods of mounting the light emitting diode chip 1 on the lead frame 2. The light emitting diode chips 1 can be classified into three types, as shown in FIGS. 2A-2C, according to the positioning of two electrodes thereof, in other words, how the light emitting diode chip 1 is mounted on the lead frame 2.

FIG. 2A illustrates a light emitting diode chip which has electrodes on its top and bottom surfaces. An electrode (lower electrode) 1*a* facing the lead frame 2 is electrically connected to one piece 2*a* of a lead frame 2 by solder 4. An electrode (upper electrode) 1*b* opposite to the lead frame 2 is electrically connected to an adjacent piece 2*b* of the lead frame 2 by a bonding wire 5. The solder 4 may be replaced by a variety of conductive pastes which satisfy the conductivity and the function of fixing a light emitting diode chip similar to the solder, an anisotropic conductive paste which has the conductivity only in an arbitrary direction, these conductive pastes formed into sheets, or the like.

FIG. 2B illustrates an example of how to mount a light emitting diode chip which has electrodes at two locations on the top surface, i.e., opposite side to the lead frame 2. The electrodes 1*a*, 1*b* on the top surface of the light emitting diode chip 1 are electrically connected to lead frame pieces 2*a*, 2*b* adjacent to each other (a pair of lead frames) by bonding wires 5*a*, 5*b*, respectively. In this structure, since no conductivity is required for fixing the light emitting diode chip 1, a non-conductive adhesive may be used instead of the solder 4.

FIG. 2C illustrates a light emitting diode chip which has electrodes at two locations on the bottom surface, i.e., facing the lead frame 2. The respective electrodes 1*a*, 1*b* on the bottom surface are electrically connected and fixed to adjacent lead frame pieces 2 by solder 4*a*, 4*b*, respectively.

FIG. 1 illustrates the light emitting diode chips 1 in the form shown in FIG. 2C, i.e., those which have the electrodes at two locations on the bottom surface, connected to adjacent lead frame pieces 2 by the solders 4, by way of example. In the following description, including other embodiments, the form of mounting the light emitting diode chip illustrated in FIG. 2C is given as an example, but any of the light emitting diode chip mounting methods illustrated in FIGS. 2A-2C may be used unless otherwise noted. The mounting methods illustrated in FIGS. 2A, 2B permit light emitting diode chips to be mounted on lead frames which are even spaced away from each other, facilitate the mounting, and accomplish highly reliable mounting. The mounting method illustrated in FIG. 2C, on the other hand, is also called "flip-chip mounting," and excels in the light emitting efficiency and reliability because light emitting diodes mounted thereby can dissipate much heat from their light emitting layers, though the spacing between lead frames must be reduced to the size of the light emitting diode chip or less.

Also, while FIG. 1 shows the lead frames having the same surface area, the red light emitting diode chips may be connected to a lead frame having a larger surface area to improve the heat dissipation characteristic and thus prevent a reduced efficiency. This is because, among the red, green, and blue light emitting diodes used in the light source unit of FIG. 1, the red light emitting diode chip has a particularly large temperature dependence, and therefore exhibits a sudden decrease in efficiency at higher temperatures, as compared with the green and blue light emitting diode chips.

The lead frame 2 is formed by stamping or etching a metal reglet of approximately 0.1 mm to 3.0 mm thick or a contour strip having a thicker area and a thinner area. A material used for the lead frame 2 may be copper, an alloy mainly containing copper, an iron-nickel alloy, or the like. Since a majority of power applied to a light emitting diode chip converts to heat which reduces the light emitting efficiency, copper which has a high thermal conductivity or an alloy mainly containing copper is preferably used at any cost in view of the light emitting efficiency and reliability. In addition, silver or gold may be plated on the surface of the lead frame 2, on which the light emitting diode chip 1 is mounted, to improve the reliability of the mounting.

Such plating further contributes to an improvement in the light utilization efficiency of the illuminating apparatus because light emitted from the light emitting diode chip 1 reflects on the plated surface of the lead frame 2 when it is incident thereon. This type of plating includes entire plating, linear plating, spot plating, and the like, any of which may be used. In the following description, including other embodiments, no reference will be particularly made as to whether or not the surface of the lead frame is plated, unless otherwise noted. Also, with regard to the shape of the lead frame, the lead frame described below will be basically shaped in the most simplified rectangle, unless otherwise noted, but it should be understood that the lead frame may be formed in any other shape.

The transparent sealer 3 can be made of a variety of transparent resins, and can be formed by injection molding, transfer molding, potting, a variety of printing methods, and the like. The transparent sealer 3 preferably has a high transparency, a resistance to heat and light, and a low moisture permeability. The transparent sealer 3 may be shaped into a convex or a concave lens which effectively converges or scatters light radiated by the light emitting diode chip. A plurality of light emitting diode chips, which emit different colors of light, are integrated within the transparent sealer 3, such that the light emitting diode chips can be efficiently combined to mix the colors to emit the resulting light.

Further, the transparent sealer 3 may be mixed with beads having different indexes of refraction to improve the diffusion, thereby improving the uniformity and the efficiency of extracting the light from the light emitting diode chips. A transparent sealer containing the diffusion beads and a transparent sealer not containing the diffusion beads may be used in lamination. In the following description of the present invention, including other embodiments, the transparent sealer used in a single layer is given as an example, but any of the foregoing transparent sealers may be used.

According to the first embodiment, the light emitting diode chips which emit light of three different colors (red, green, blue) are sealed by the transparent sealer, and four light emitting diode chips of the same color are connected in series, thereby making it possible to facilitate the mixture of the colors, improve the uniformity of the characteristics of illuminating light, and simplify a control circuit for controlling the respective colors. Also, in the first embodiment, since two green light emitting diode chips are mounted on the lead frames 22, 23 and sealed by the transparent sealer 3 in each set of four light emitting diode chips, the lead frames 22, 23 may be controlled simultaneously.

In the first embodiment, four light emitting diodes of the same color are connected in series, but if an increased number of chips are connected in series, the brightness can be correspondingly increased, thus simplifying the configuration without increasing the control circuit. However, if even one of light emitting diode chips is defectively mounted, the overall light source unit fails, in which case a larger number of chips connected in series would cause a larger damage, so that ten or less chips are preferably connected in series.

In the method of mounting the light emitting diode chip illustrated in FIG. 1 or 2C, i.e., in the light emitting diode chip 1 having electrodes at two locations on the bottom surface thereof, the respective electrodes are electrically connected and fixed to two adjacent lead frame pieces 2*a*, 2*b*, respectively. The mounting of the light emitting diode chip 1 having two electrodes on the bottom surface thereof causes the light emitting diode chip 1 itself to straddle the spacing between the two lead frame pieces 2*a*, 2*b*. Therefore, the spacing between the two lead frame pieces 2*a*, 2*b* is preferably as narrow as possible, whereas a wider spacing between the two lead frames 2*a*, 2*b* makes the manufacturing easier in consideration of the processing accuracy.

Figure 3A:
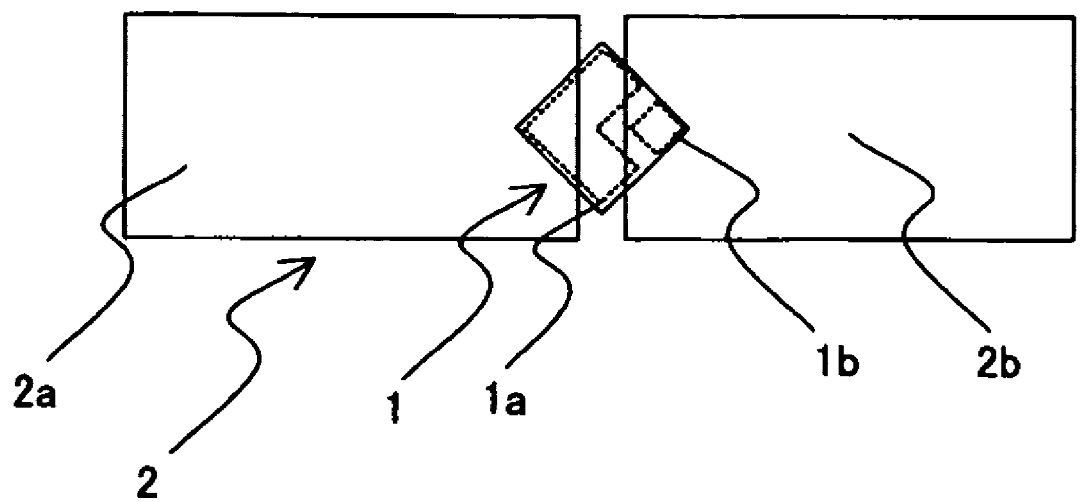
FIGS. 3A, 3B are schematic top plan views for describing other examples of mounting the light emitting diode chip illustrated in FIG. 2C.
Figure 3B:
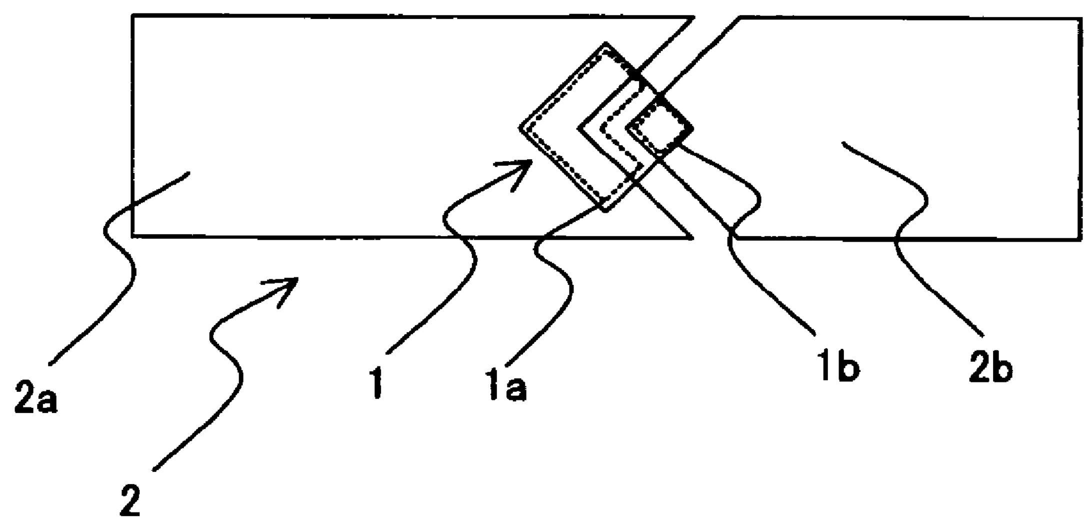

FIGS. 3A, 3B are schematic top plan views for describing other examples of the method of mounting a light emitting diode chip illustrated in FIG. 2C. As illustrated in FIG. 3A, the light emitting diode chip 1 having two electrodes at two locations on the bottom surface thereof may be mounted in such a manner that the diagonal direction of the bottom surface (opposing the lead frame pieces 2*a*, 2*b*) of the light emitting diode chip 1 is oriented in parallel with the one and the other pieces 2*a*, 2*b* of the lead frame 2, and the electrodes 1*a*, 1*b* are connected to the lead frame 2 such that the electrodes 1*a*, 1*b* are placed on the one and the other pieces 2*a*, 2*b* of the lead frame 2, respectively, thereby making it possible to accomplish desired mounting even with a lower processing accuracy of the lead frame 2 or a lower alignment accuracy of the light emitting diode chip 1 when it is mounted.

Alternatively, as illustrated in FIG. 3B, the one piece 2*a* and the other piece 2*b* of the lead frame 2 may be made such that the opposing edges thereof are formed in a V-shape (for example, with a vertex angle of approximately 270°) and an inverted V-shape (for example, with a vertex angle of approximately 90°), respectively. Then, the light emitting diode 1 may be mounted such that its diagonal direction is oriented in parallel with the one and the other pieces 2*a*, 2*b* of the lead frame 2, and the electrodes 1*a*, 1*b* are positioned on the one and the other pieces 2*a*, 2*b* of the lead frame 2, in a manner similar to that illustrated in FIG. 3A.

Second Embodiment

Figure 4A:
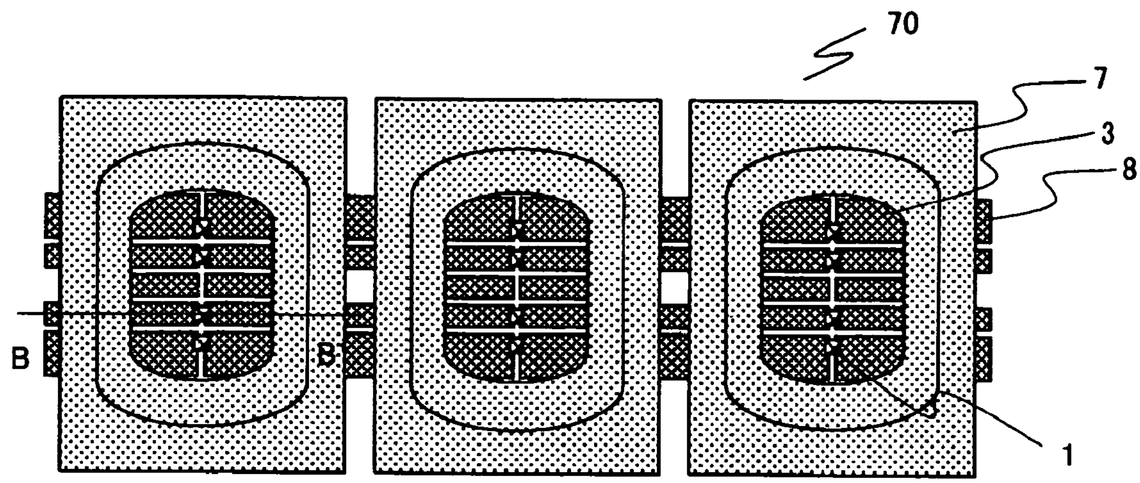
FIGS. 4A, 4B are diagrams for describing a light source unit according to a second embodiment of the present invention, where
Figure 4B:
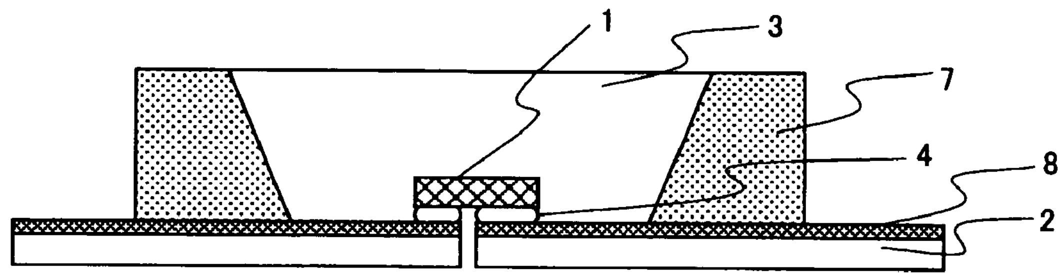

FIGS. 4A, 4B are diagrams for describing a light source unit according to a second embodiment of the present invention, where FIG. 4A is a top plan view of the light source unit, and FIG. 4B is a cross-sectional view taken along a line B-B' in FIG. 4A. The light source unit of the second embodiment comprises a reflecting mold in addition to the components of the first embodiment. The light source unit 70 of this embodiment can efficiently emit light radiated from the light emitting diode chips 1 in front by the action of the reflecting mold 7. Also, when the reflecting mold 7 is made of a diffuse reflective material, colored light from the respective light emitting diode chips 1 can be mixed in a desired manner.

The reflecting mold 7 may be implemented by a resin- or a ceramic-based mold, or a ring made of a variety of metals, the bottom of which is insulated. Further, a metal thin film may be formed on the surface of these materials to improve the reflectivity. A silver plating 8 is applied to at least a portion of the lead frame 2 which is in contact with the transparent sealer 3. Advantageously, the lead frame 2 applied with the plating 8 can reflect light from the light emitting diode chips 1, diffused light from the reflecting mold 7, and reflected light at a high reflectivity to efficiently utilize the light. Here, the reflecting mold 7 can be made by injection molding, transfer molding or the like, together with the lead frame 2, and preferably exhibits heat resistance, light resistance, low moisture permeability, and low light absorption.

Third Embodiment

Figure 5:
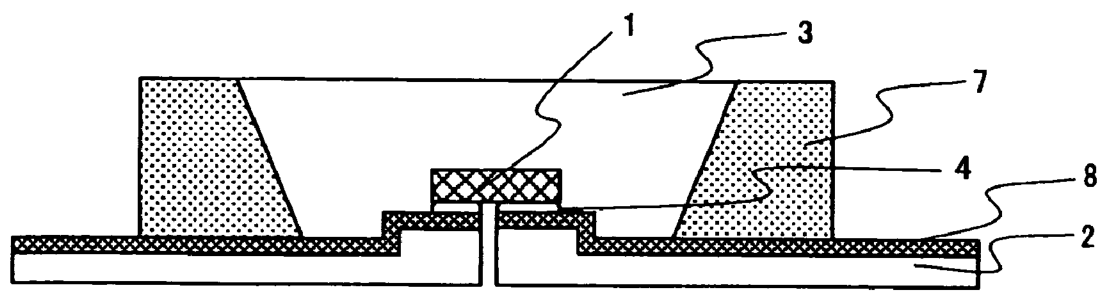
FIG. 5 is a cross-sectional view for describing a light source unit according to a third embodiment of the present invention.

FIG. 5 is a diagram for describing a light source unit according to a third embodiment of the present invention, and corresponds to a cross-sectional view taken along the line B-B' in FIG. 4A. A top plan view of the light source unit according to the third embodiment is similar to FIG. 4A. The light source unit 70 of the third embodiment increases the thickness of the lead frame 2 in an area on which the light emitting diode chip 1 is mounted. In this way, heat generated by the light emitting diode chip 1 can be effectively dissipated to the lead frame 2. This design of the lead frame 2 can be applied to the first embodiment to produce similar effects. In the third embodiment, the position at which the light emitting diode chip 1 is mounted is higher than the bottom surface of the reflecting mold 7, so that light is effectively directed to the reflecting mold 7 and therefore reflected to the top surface (opposite to the lead frame 2). Further, in consideration of a manufacturing margin and the like, the light utilization efficiency is effectively improved because the bottom surface of the reflecting mold 7 (an end area of a surface in contact with the plating 8 close to the light emitting diode chip) can be reduced in thickness to zero.

Fourth Embodiment

Figure 6:
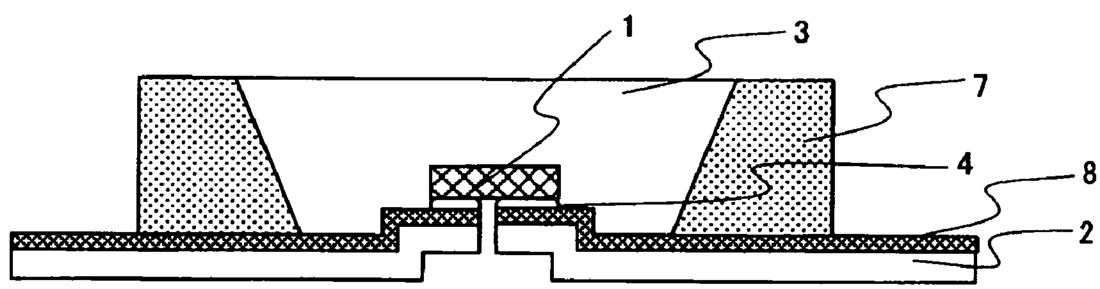
FIG. 6 is a cross-sectional view for describing a light source unit according to a fourth embodiment of the present invention.

FIG. 6 is a diagram for describing a light source unit according to a fourth embodiment of the present invention, and corresponds to a cross-sectional view taken along the line B-B' in FIG. 4A. A top plan view of the light source unit according to the fourth embodiment is similar to FIG. 4A. In the third embodiment, the light emitting diode chip 1 is mounted on a plane higher than the bottom surface of the reflecting mold 7 with the lead frame 2 which is made thicker in the area on which the light emitting diode chip 1 is mounted. In the fourth embodiment, on the other hand, the lead frame 2 is bent toward the reflecting mold 7 in the area on which the light emitting diode chip 1 is mounted, such that the light emitting diode chip 1 is mounted on a plane higher than the bottom surface of the reflecting mold 7. This structure can also effectively direct light to the reflecting mold 7 to reflect the light toward the top surface.

Fifth Embodiment

Figure 7A:
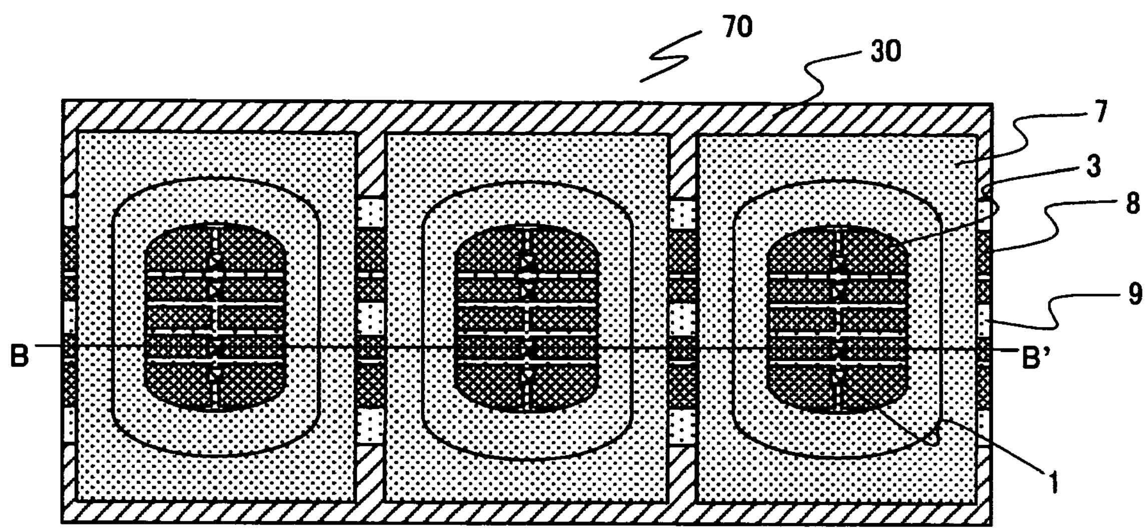
FIGS. 7A, 7B are diagrams for describing a light source unit according to a fifth embodiment of the present invention, where
Figure 7B:
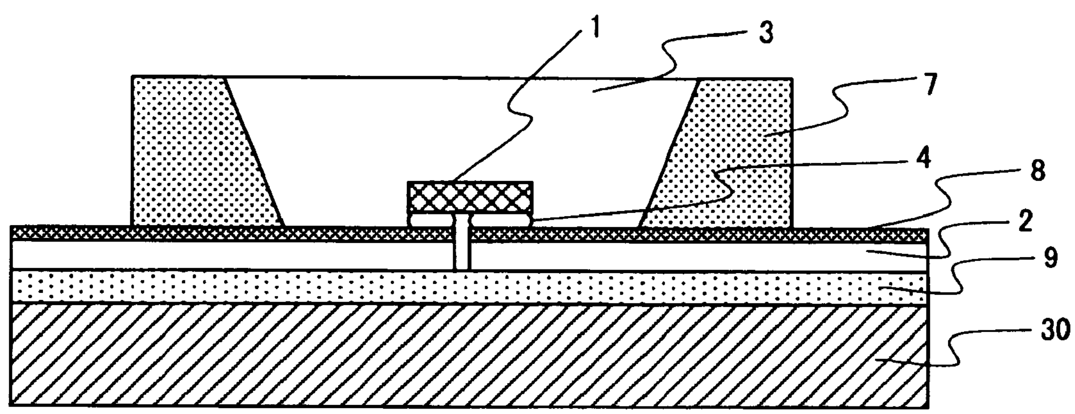

FIGS. 7A, 7B are diagrams for describing a light source unit according to a fifth embodiment of the present invention, where FIG. 7A is a top plan view, and FIG. 7B is a cross-sectional view taken along a line B-B' in FIG. 7A. The light source unit 70 of the fifth embodiment comprises a reflecting mold 7, an insulating layer 9, and a heat dissipation board 30 in addition to the components of the second embodiment. The light source unit 70 of the fifth embodiment can efficiently emit light radiated from the light emitting diode chip 1 by the action of the reflecting mold 7. Also, when the reflecting mold 7 is made of a diffuse reflective material, colored light from the respective light emitting diode chips 1 can be mixed in a desired manner.

The reflecting mold 7 may be implemented by a resin- or a ceramic-based mold, or a ring made of a variety of metals, the bottom of which is insulated. Further, a metal thin film may be formed on the surface of these materials to improve the reflectivity. A silver plating 8 is applied to at least a portion of the lead frame 2 which is in contact with the transparent sealer 3. Advantageously, the plating 8 can reflect light from the light emitting diode chips 1, diffused light from the reflecting mold 7, and reflected light at a high reflectivity to efficiently utilize the light.

The insulating layer 9 is disposed on the bottom surface of the lead frame 2, and the heat dissipating board 30 is attached below the insulating layer 9. Here, when the heat dissipating board 30 is made of a metal or a ceramic which has a high coefficient of thermal conductivity, heat generated by the light emitting diode chip 1 can be efficiently dissipated to the heat dissipating board 30, thus effectively preventing a reduction in the light emitting efficiency, resulting from a rise in the temperature in the light emitting diode chips 1, to efficiently utilize the light radiated therefrom.

Further, the heat dissipation characteristic can be improved to increase the light emission efficiency by micro-processing the bottom surface of the heat dissipating board 30 to increase the surface area thereof. It should be understood that the insulating layer 9 may be removed when an insulating board made of ceramic is used for the heat dissipating board 30.

Sixth Embodiment

Figure 8:
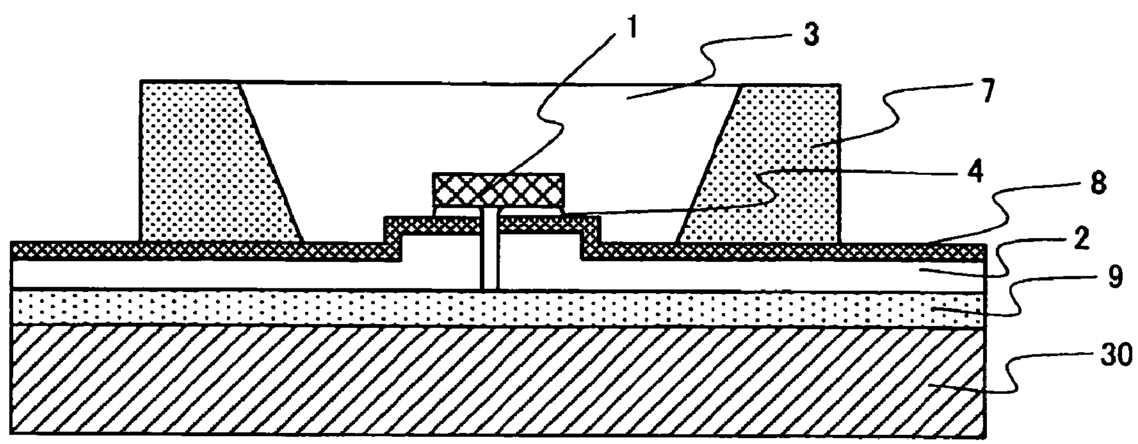
FIG. 8 is a cross-sectional view for describing a light source unit according to a sixth embodiment of the present invention.

FIG. 8 is a diagram for describing a light source unit according to a six embodiment of the present invention. FIG. 8 corresponds to a cross-sectional view taken along the line B-B' in FIG. 7. The sixth embodiment differs from the fifth embodiment in that the lead frame 2 is made thicker in the area on which the light emitting diode chip 2 is mounted. The sixth embodiment more effectively dissipates heat generated by the light emitting diode chip 1 to the lead frame 2. This design of the lead frame 2 including a thicker area can be applied to any of the embodiments which employ a lead frame having a uniform thickness.

Also, since the light emitting diode chip 1 is mounted on a plane higher than the bottom surface of the reflecting mold 7, the light radiated therefrom is effectively directed to the reflecting mold 7 from which the light is reflected toward the top surface. Further, in consideration of a manufacturing margin and the like, the light utilization efficiency is effectively improved because the bottom surface of the reflecting mold 7 (an end area of a surface in contact with the plating 8 close to the light emitting diode chip) can be reduced in thickness to zero. In the sixth embodiment, the light emitting diode chip 1 is mounted on a plane higher than the bottom surface of the reflecting mold 7 with the lead frame 2 which is made thicker in the area on which the light emitting diode chip 1 is mounted. Alternatively, the lead frame 2 may be bent to mount the light emitting diode chip 1 on a higher plane, in a manner similar to FIG. 6, to produce similar effects, as a matter of course.

Seventh Embodiment

Figure 9A:
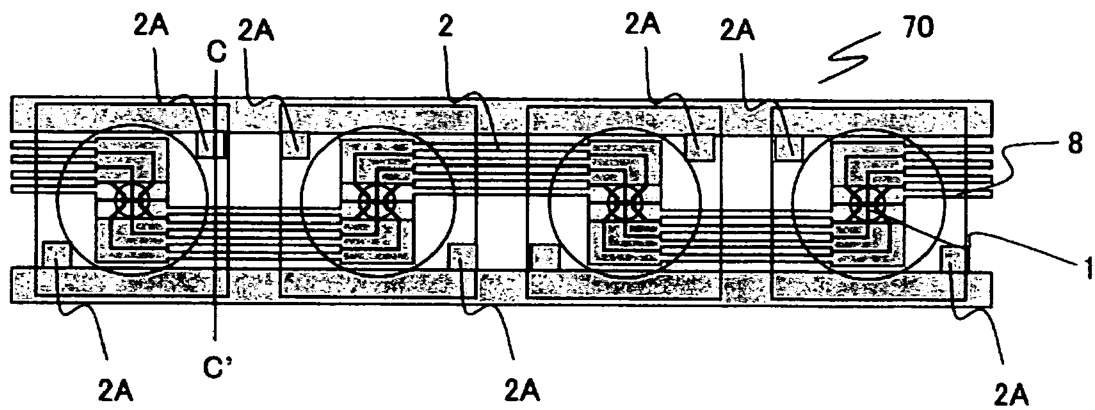
FIGS. 9A-9C are diagrams for describing a light source unit according to a seventh embodiment of the present invention, where
Figure 9B:
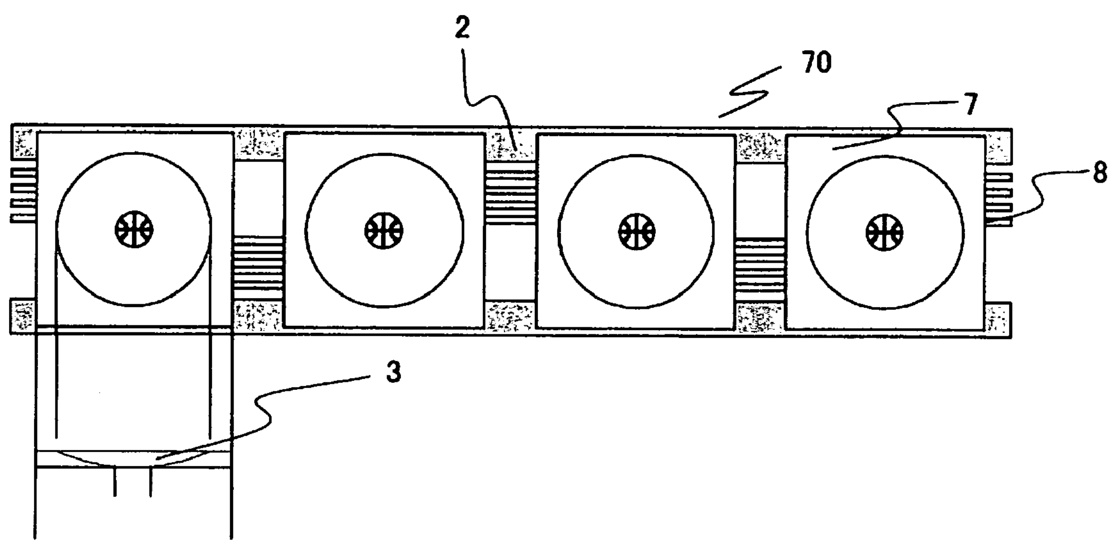
Figure 9C:
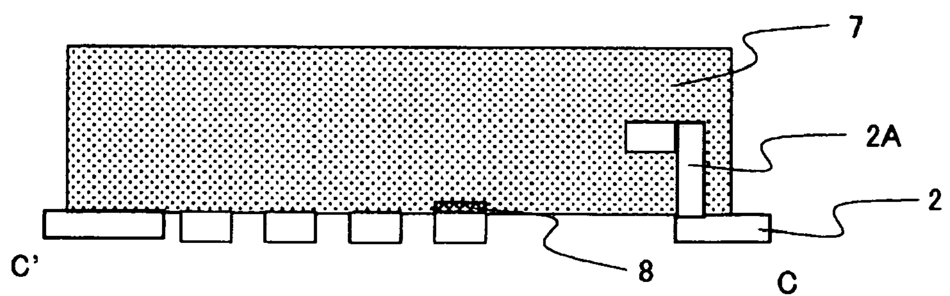

FIGS. 9A-9C are diagrams for describing a light source unit according to a seventh embodiment of the present invention. FIGS. 9A, 9B show top plan views, wherein FIG. 9B partially shows a cross-section, and FIG. 9C shows a cross-sectional view taken along a line C-C' in FIG. 9A. The light source unit 70 of the seventh embodiment comprises four light emitting diode chips 1, four sets of lead frames 2, a transparent sealer 3, and a reflecting mold 7. Further, a silver (Ag) plating 8 is applied to the surface of the lead frame 2 on which the light emitting diode chips 1 are mounted. Here, a partial plating in stripes is employed in order to increase the adhesivity of the silver plating to the reflecting mold 7.

The seventh embodiment employs a wiring pattern for the lead frames 2, different from the first embodiment, which comprises an even number of wires in axial symmetry such that the light emitting diode chips 1 of the same color can be connected in series. Multiple light source units can be manufactured in sequence with the elongated lead frames 2 to increase the productivity, thus accomplishing a significant reduction in cost. While FIG. 9 shows four sets of the lead frames 2, three sets or more of the lead frames 2 will not cause any problem in consideration of the mounting of red, green, and blue light emitting diodes.

The light source unit 70 of the seventh embodiment may be provided with bends 2A in the respective lead frames 2, as illustrated in FIG. 9C, to resist shifts and stresses, in order to increase the adhesivity of the reflecting mold 7 to the lead frame 2, and to improve the reliability. The reflecting mold 7 can be made by injection molding, transfer molding or the like, together with the lead frame 2, and preferably exhibits heat resistance, light resistance, low moisture permeability, and low light absorption. Except for the foregoing, the respective embodiments described above can be applied to the seventh embodiment to produce similar effects.

Eighth Embodiment

Figure 10A:
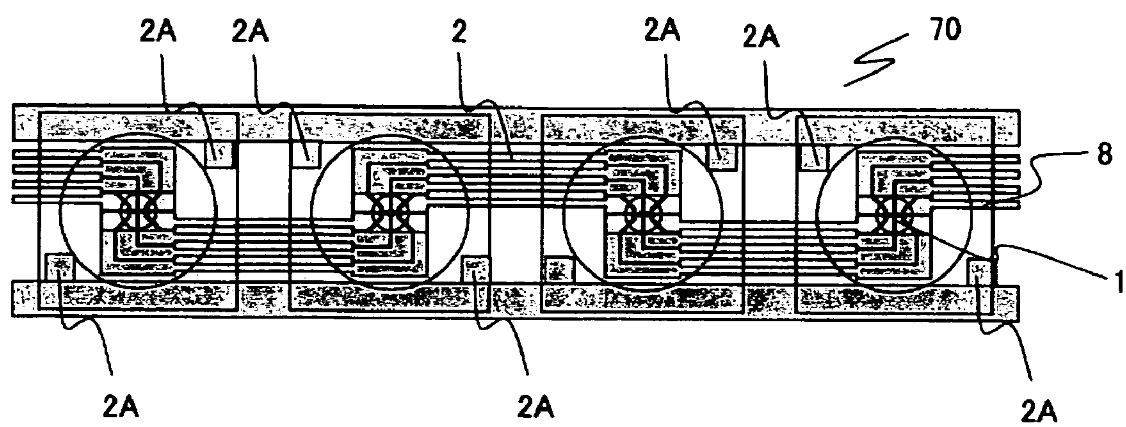
FIGS. 10A, 10B are top plan views for describing a light source unit according to an eighth embodiment of the present invention.
Figure 10B:
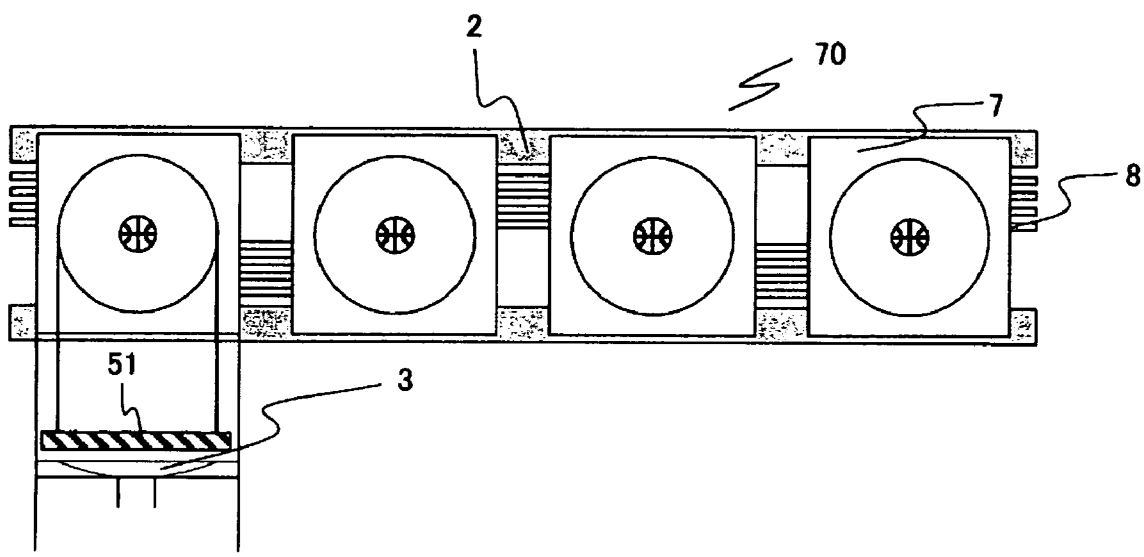

FIGS. 10A, 10B are diagrams for describing a light source unit according to an eighth embodiment of the present invention, where FIGS. 10A, 10B show top plan views. FIG. 10B partially shows a cross-section as well. The eighth embodiment differs from the seventh embodiment in that a reflective polarizer 51 is disposed only on a light emitting area (opening) of the reflecting mold 7. Materials suitable for use as the reflective polarizer 51 can be, for example, DBEF manufactured by 3M which is a multiple laminate layer film comprised of an anisotropic layer and an isotropic layer, and PCF manufactured by Nitto Denko Corporation using a cholesteric polymer film. With the employment of the reflective polarizer 51, non-polarized light emitted from the light emitting diode chip 1 impinges on the reflective polarizer 51.

One type of linearly polarized light (or circularly polarized light) transmits the reflective polarizer 51, while the other type of linearly polarized light (or circularly polarized light) is reflected by the reflective polarizer 51 back to the light emitting diode chip 1, but since the polarization is eliminated by the reflecting mold 7, the linearly polarized light again impinges on the reflective polarizer 51. By repeating the foregoing, efficiently polarized light can be emitted. When the reflective polarizer 51 is fabricated in a large area, a price per unit area is increased because failures such as defects occur with a high probability. To avoid this inconvenience, the reflective polarizer 51 is disposed only on the opening, as in the eighth embodiment, so that the reflective polarizer 51 is required to have only a small area, thus significantly reducing the cost. Except for the foregoing, the respective embodiments described above can be applied to the seventh embodiment to produce similar effects.

Ninth Embodiment

Figure 11:
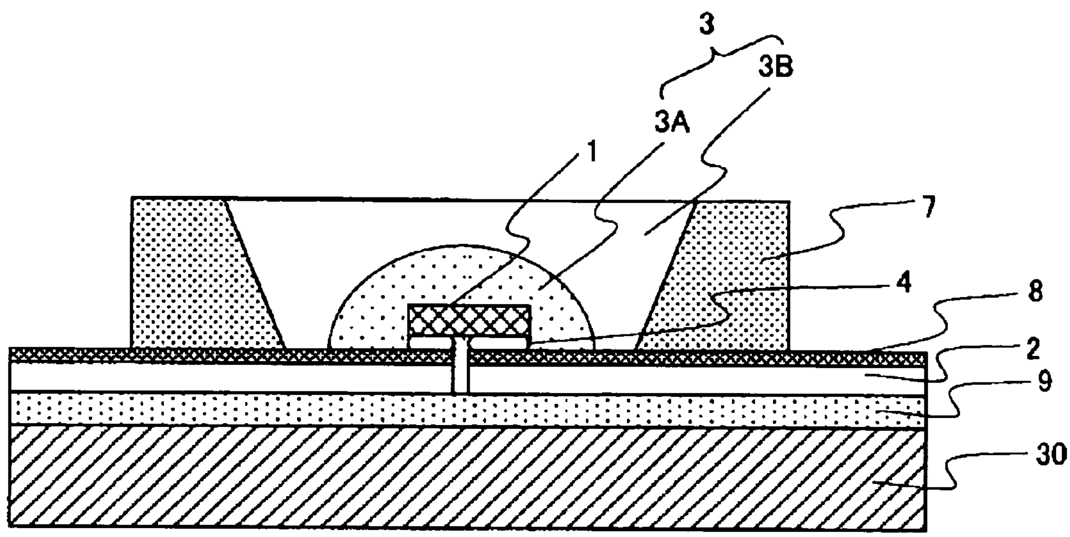
FIG. 11 is a cross-sectional view for describing a light source unit according to a ninth embodiment of the present invention.

FIG. 11 is a diagram for describing a light source unit according to a ninth embodiment of the present invention. FIG. 11 corresponds to a cross-sectional view taken along the line C-C' in FIG. 9A. The ninth embodiment differs from the foregoing embodiments in that the transparent sealer 3 is in a two-layer structure comprised of a diffusion layer 3A and a transparent layer 3B. A normal transparent sealer has a refractive index of approximately 1.5, and transparent particulates can be mixed in the transparent sealer to improve the diffusion, the uniformity, and the efficiency of extracting light from the light emitting diode chip.

The ninth embodiment is configured to improve the light extraction efficiency with the diffusion layer 3A surrounding the light emitting diode chip 1, and the transparent layer 3B covering the diffusion layer 3A. Further, since the substrate of the light emitting diode chip 1 and light emitting layer have a refractive index of two or more, and since the light emitting diode chip 1 is generally in the shape of rectangular solid, resulting total reflection impedes the emission of most light, thus encountering difficulties in improving the light extraction efficiency. To solve this problem, in the ninth embodiment, transparent particulates having a high refractive index is mixed into the transparent sealer in a region close to the light emitting diode chip 1 to form the diffusion layer 3A, such that this diffusion layer 3A breaks the total reflection condition to improve the efficiency of extracting light from the light emitting diode chip 1.

While the mixed transparent particulates preferably have the refractive index of two or more, the refractive index of 1.6 or more produces sufficient effects. In this way, the transparent sealer 3 made in the two-layer structure can improve the uniformity and light utilization efficiency. Also, if the transparent layer 3B can ensure the humidity resistance, a material having a high refractive index can be selected for the diffusion layer 3A in order to improve the extraction efficiency without taking into account the performance. The ninth embodiment is similar to the respective embodiments described above except for the foregoing difference in the transparent sealer 3, so that the ninth embodiment can produce its own effects in addition to the effects produced by the respective embodiments described above.

Tenth Embodiment

Figure 12:
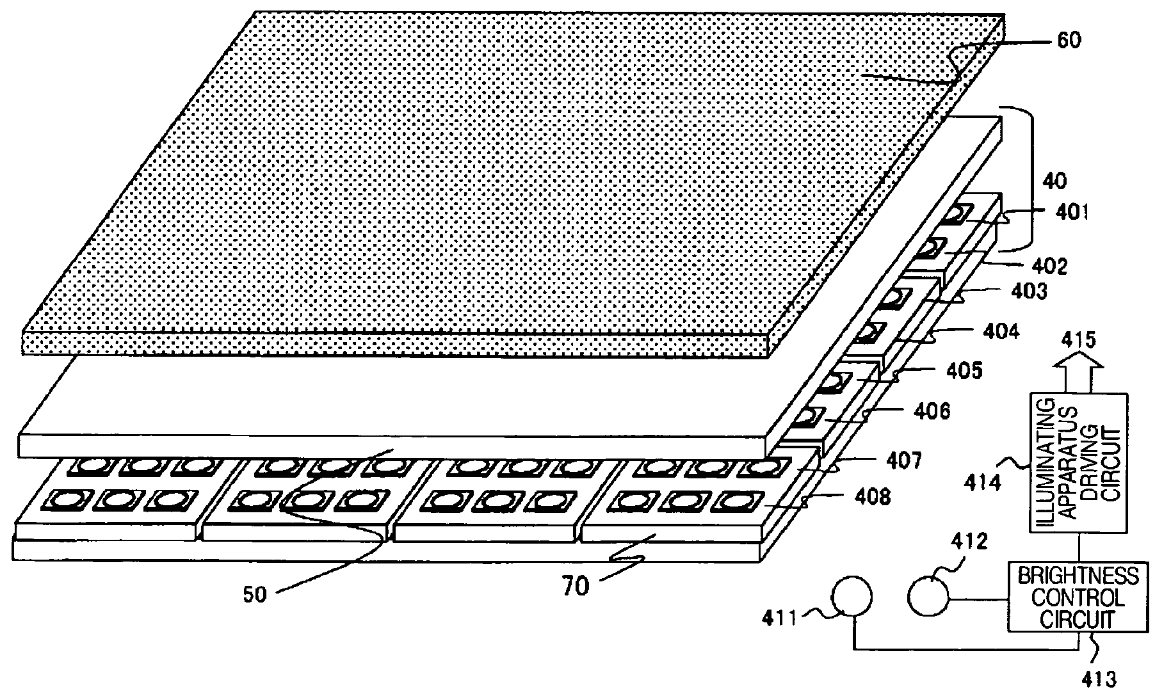
FIG. 12 is a perspective view for describing an illuminating apparatus using the light source units according to the present invention, and a display apparatus using this illuminating apparatus in one embodiment.

FIG. 12 is a perspective view for describing an illuminating apparatus which employs the light source units according to the present invention, and a display apparatus which employs this illuminating apparatus according to one embodiment. The illuminating apparatus 40 comprises a plurality of the light source units 70, described in the respective embodiments, arranged in an array, and optical members 50 which includes a diffuser panel provided with a gap, a prism sheet and the like.

A non-light emitting display panel 60 is disposed over the illuminating apparatus 40 to complete a display apparatus. The illuminating apparatus 40 is also called the "back light" from the fact that the illuminating apparatus 40 is disposed on the rear surface (back surface) of the non-light emitting display panel 60.

For improving the uniformity of light emitted from the light source units 70, a prism sheet is disposed on the non-light emitting display panel 60. The non-light emitting display panel 60 can arbitrarily control, on a pixel-by-pixel basis, the transmission and blocking of light from the illuminating apparatus 40 disposed on the back surface thereof to display arbitrary images and characters. The non-light emitting image display panel 60 visually displays images by controlling the amount of light from the illuminating apparatus 40 which transmits the non-light emitting image display panel 60.

Giving display modes for illustration, the non-light emitting display panel 60 in the tenth embodiment can operate in a liquid crystal display mode (liquid crystal display panel), an electrophoretic display mode (electrophoretic display panel), an electrochromic display mode (electrochromic display panel), an electronic powder liquid display mode (electronic power liquid display apparatus), and the like, and can utilize all transmission display modes in which the panel itself does not emit light.

The optical members 50 include a diffuser panel, a reflector panel, a prism sheet, a polarized reflector panel, and the like which are utilized individually or in combination as appropriate to accomplish an arbitrary directivity and light uniformity. Further, preferably, a reflector panel may be disposed other than a light emitting area of the light source unit to reuse reflected light from the optical members 50, thus improving the light utilization efficiency. Also, the display apparatus comprises an illuminating apparatus driving circuit which can control the brightness of the display apparatus independently for each color row.

Since the display apparatus of the tenth embodiment employs the illuminating apparatus which is composed of a plurality (M rows×N columns, where M, N are integers equal to or larger than one, and at least one of M and N is an integer equal to or larger than two) of the light source units described in any of the embodiments described above, the illuminating apparatus can be manufactured at a low cost, leading to a reduction in the cost of the overall display apparatus. Also, in comparison with an illuminating apparatus which employs conventional fluorescent tubes, the light emitting diodes can contribute to improvements in the moving image characteristics of the display apparatus because they response by turning on and off at high speeds. Particularly, when light emitting diodes which emit red, green, and blue light are employed for an illuminating apparatus to create a display apparatus, a wide color reproduction range and a very vivid display can be provided by the resulting display apparatus, as compared with a conventional illuminating apparatus which employs fluorescent tubes. Also, the light emitting diodes has another advantage of harmlessness to the environment because they do not contain mercury.

Eleventh Embodiment

The configuration of an eleventh embodiment will be described with reference to FIG. 12. Though similar in the basic configuration to the tenth embodiment, the light emitting diode chips can contribute to improvements in the moving image characteristics because of its high on/off response speed. Specifically, as indicated by rows 401-408 of the light source units illustrated in FIG. 12, the light source units are divided in the vertical direction into eight groups, each of which is driven to control light emitted therefrom. In other words, since the non-light emitting display panel 60 also displays an image through write scan (scanning signal), the light emitting diodes are duty-scrolled sequentially from the rows 401 to 408 by a scanning signal after the non-light emitting display panel 60 has been stabilized in the light transmission state to produce more vivid moving images.

Twelfth Embodiment

The configuration of a twelfth embodiment will be described with reference to FIG. 12. The basic configuration is similar to those of the tenth and eleventh embodiments. The display apparatus comprises one or both of a light sensor 411 and a temperature sensor 412 for detecting the temperature. The output from one or both of the light sensor 411 and temperature sensor 412 is applied to a brightness control circuit 413. The brightness control circuit 413 controls an illuminating apparatus driving circuit 414 based on the output from one or both of the optical sensor 411 and temperature sensor 412 to independently control the brightness for each color on a row-by-row basis.

Alternatively, the brightness control circuit 413 can be modified to control the brightness of the illuminating apparatus 40 on a row-by-row basis in synchronism with the scanning signal per row of the non-light emitting display panel 60. Since the light emitting diode chips significantly vary from one chip to another, and vary in brightness depending on the temperature, the light or temperature sensor is disposed within the illuminating apparatus 40, as shown in FIG. 12, such that the output from the sensor is relied on to control the magnitude of light emitted from each of the eight sections of the light source units divided into the rows 401-408, as shown in FIG. 12, through PM modulation, thus making it possible to keep the brightness and colors constant even if the environment changes.

The aforementioned respective embodiments have been described in connection with the display apparatus which comprises the non-light emitting display panel 60, and the illuminating apparatus 40 comprised of the light source units two-dimensionally arrayed in a plane and placed on the back surface of the non-light emitting display panel 60 for uses as a so-called directly-underlying back light. The present invention, however, is not so limited, but may employ a light source comprised of a plurality of colors of light emitting diode chips, similar to those in the embodiments, arranged in one dimension, which is combined with a light guiding plate to provide a so-called side edge type back light.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A light source unit comprising:

a plurality of light emitting diode chips in at least three different colors;

at least three sets of lead frames, each associated with said light emitting diode chips in the same color connected in series; and a transparent sealer for integrally sealing said plurality of light emitting diode chips;

wherein said plurality of light emitting chips of the same color which are connected in series among said plurality of light emitting diodes in the at least three different colors are independently controllable.

2. A light source unit according to claim 1, wherein:

each said lead frame includes bends at both ends thereof.

3. A light source unit according to claim 1, wherein:

said light emitting diode chips include a red light emitting diode chip, a green light emitting diode chip, and a blue light emitting diode chip, and a lead frame associated with the red light emitting diode chip has a surface area larger than the surface areas of the other lead frames associated with the light emitting diode chips in the other colors.

4. A light source unit according to claim 1, further comprising a reflecting mold around said transparent sealer which seals said light emitting diode chips in the at least three colors for emitting light from said light emitting diode chips in front.

5. A light source unit according to claim 4, wherein:

said lead frame includes a bend in a portion thereof surrounded by said reflecting mold.

6. A light source unit according to claim 4, further comprising a reflective polarizer disposed on a light radiating area of each said light emitting diode chip.

7. A light source unit according to claim 1, wherein:

each said lead frame has a larger thickness in an area thereof on which said light emitting diode chip is mounted than the remaining area.

8. A light source unit according to claim 1, wherein:

said light emitting diode chip is mounted on said lead frame in an area higher than the remaining area of said lead frame.

9. A light source unit according to claim 1, wherein:

said lead frame is made of copper or an alloy mainly containing copper, and said lead frame is plated with silver or a metal material mainly containing silver in at least an area thereof on which said light emitting diode chip is mounted.

10. A light source unit according to claim 1, wherein:

said transparent sealer comprises two or more layers, and at least a layer of said transparent sealer in contact with said light emitting diode chip includes particulates having a different refractive index to exhibit a scattering property.

11. A light source unit according to claim 10, wherein:

said particulates included in said transparent sealer exhibiting the scattering property has a refractive index of 1.6 or more.

12. A light source unit according to claim 1, wherein:

said light emitting diode chip comprises two electrodes disposed on the same surface, said electrodes being oriented toward said lead frame and mounted to said lead frame.

13. A light source unit according to claim 1, wherein:

said light emitting diode chip comprises two electrodes disposed on different surfaces from each other, and said electrode disposed on a surface opposite to said lead frame is connected to said lead frame through a wire.

14. A light source unit according to claim 1, wherein:

said lead frame is adhered to a metal board through an insulating layer.

15. An illuminating apparatus comprising:

the light source units according to claim 1 arranged in M rows×N columns (M, N are integers equal to or more than one, and at least one of M and N is an integer equal to or more than two); and a diffuser panel disposed on a light emitting side of said light source units through a gap.

16. An illuminating apparatus comprising:

the light source units according to claim 1 arranged in M rows×N columns (M, N are integers equal to or more than one, and at least one of M and N is an integer equal to or more than two);

a diffuser panel disposed on a light emitting side of said light source units through a gap; and a reflector panel disposed on said light source units other than light radiating areas.

17. An illuminating apparatus comprising:

the light source units according to claim 1 arranged in M rows×N columns (M, N are integers equal to or more than one, and at least one of M and N is an integer equal to or more than two);

a diffuser panel disposed on a light radiating side of said light source units through a gap; and a reflector panel disposed on said light source units other than light radiating areas.

18. An illuminating apparatus comprising:

the light source units according to claim 1 arranged in M rows×N columns (M, N are integers equal to or more than one, and at least one of M and N is an integer equal to or more than two);

a diffuser panel disposed on a light radiating side of said light source units through a gap;

a reflector panel disposed on said light source units other than light radiating areas; and a brightness controller for independently controlling said light emitting diode chips in the same color all connected in series for each of said rows.

19. An illuminating apparatus comprising:

the light source units according to claim 1 arranged in M rows×N columns (M, N are integers equal to or more than one, and at least one of M and N is an integer equal to or more than two), said light emitting diode chips in the same color being all connected in series for each of said rows;

a diffuser panel disposed on a light radiating side of said light source units through a gap;

a reflector panel disposed on said light source units other than light radiating areas; and a brightness control circuit for controlling said light emitting diode chips on a color-by-color basis through PM modulation control.

20. An illuminating apparatus comprising:

the light source units according to claim 1 arranged in M rows×N columns (M, N are integers equal to or more than one, and at least one of M and N is an integer equal to or more than two), said light emitting diode chips in the same color being all connected in series for each of said rows;

one or both of a light sensor for detecting a brightness and a temperature sensor for detecting a temperature; and a brightness control circuit for independently controlling the brightness for each of said rows of each color based on the output from one or both of said light sensor and said temperature sensor.

21. A display apparatus comprising:

a non-light emitting image display panel;

the illuminating apparatus according to claim 15 disposed on the back surface of said non-light emitting image display panel, wherein said non-light emitting image display panel controls the amount of light from said illuminating apparatus transmitting therethrough to visually display an image.

22. A display apparatus according to claim 21, further comprising:

a brightness control circuit for controlling the brightness of said illuminating apparatus on a row-by-row basis in synchronism with a scanning signal for each of said rows for controlling the amount of transmitting light from said illuminating apparatus.

* * * * *